United States Patent
Porzio et al.

(10) Patent No.: US 9,600,414 B2
(45) Date of Patent: *Mar. 21, 2017

(54) CONCURRENT MEMORY OPERATIONS

(71) Applicant: Micron Technology Inc., Boise, ID (US)

(72) Inventors: Luca Porzio, Casalnuovo (IT); Rodolphe Sequeira, Napoli (IT)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/252,623

(22) Filed: Apr. 14, 2014

(65) Prior Publication Data

US 2014/0229702 A1    Aug. 14, 2014

Related U.S. Application Data

(63) Continuation of application No. 13/223,171, filed on Aug. 31, 2011, now Pat. No. 8,700,879.

(51) Int. Cl.
*G06F 12/08* (2016.01)
*G11C 7/22* (2006.01)
*G06F 12/02* (2006.01)
*G06F 12/10* (2016.01)

(52) U.S. Cl.
CPC .......... *G06F 12/08* (2013.01); *G06F 12/0246* (2013.01); *G06F 12/10* (2013.01); *G11C 7/22* (2013.01); *G06F 2212/2022* (2013.01); *G06F 2212/657* (2013.01); *G06F 2212/7201* (2013.01); *G11C 2216/22* (2013.01)

(58) Field of Classification Search
CPC .... G06F 12/109; G06F 12/1027; G06F 12/10; G06F 2212/656; G06F 2212/682; G06F 9/30087; G06F 12/023; G06F 12/1009; G06F 11/3466; G06F 2201/865; G06F 2201/88; G06F 9/5016; G06F 12/0284; G06F 12/0246; G06F 2212/2022; G06F 2212/657; G06F 2212/7201; G06F 11/3419; G06F 9/526; G06F 12/08; G06F 9/528; G11C 2216/22; G11C 7/22
See application file for complete search history.

(56) References Cited

U.S. PATENT DOCUMENTS

| | | | |
|---|---|---|---|
| 5,276,842 A | | 1/1994 | Sugita |
| 5,744,980 A | * | 4/1998 | McGowan .......... H03K 19/1776 326/40 |
| 6,490,671 B1 | * | 12/2002 | Frank et al. .................. 711/207 |
| 8,335,892 B1 | | 12/2012 | Minkin et al. |
| 2002/0144066 A1 | * | 10/2002 | Talreja et al. ................. 711/154 |
| 2004/0117593 A1 | * | 6/2004 | Uhlig et al. .................. 711/207 |
| 2005/0172099 A1 | * | 8/2005 | Lowe ............................. 711/207 |
| 2007/0211549 A1 | | 9/2007 | Kobayashi |
| 2008/0086620 A1 | * | 4/2008 | Morris .......................... 711/203 |
| 2009/0210616 A1 | | 8/2009 | Karamcheti et al. |
| 2011/0060868 A1 | * | 3/2011 | Haukness ..................... 711/103 |
| 2011/0231594 A1 | * | 9/2011 | Sugimoto et al. ............ 711/103 |

* cited by examiner

*Primary Examiner* — Hashem Farrokh
(74) *Attorney, Agent, or Firm* — Holland & Hart LLP

(57) ABSTRACT

Subject matter disclosed herein relates to performing concurrent memory operations.

20 Claims, 5 Drawing Sheets

CONCURRENT MEMORY OPERATIONS

CROSS-REFERENCE TO RELATED APPLICATION

This application is a continuation of U.S. patent application Ser. No. 13/223,171, filed Aug. 31, 2011, titled CONCURRENT MEMORY OPERATIONS, the disclosure of which is incorporated herein by reference in its entirety. In addition, any and all applications for which a foreign or domestic priority claim is identified in the Application Data Sheet as filed with the present application are hereby incorporated by reference under 37 C.F.R. §1.57.

BACKGROUND

Field

Subject matter disclosed herein relates to memory operations, such as writing to or reading from memory.

Information

Memory devices may be employed in various electronic devices, such as computers, cell phones, PDA's, data loggers, or navigational equipment, just to name a few examples. For example, various types of nonvolatile memory devices may be employed, such as NAND flash memory, NOR flash memory or phase-change memory (PCM), just to name a few examples. In general, writing or programming processes may be used to store information, while read processes may be used to retrieve stored information. However, typically, if a write operation is being performed, another operation, such as a read operation may not be concurrently performed.

BRIEF DESCRIPTION OF THE FIGURES

Non-limiting or non-exhaustive embodiments will be described with reference to the following figures, wherein like reference numerals refer to like parts throughout various figures unless otherwise specified.

DETAILED DESCRIPTION

Figure 1:
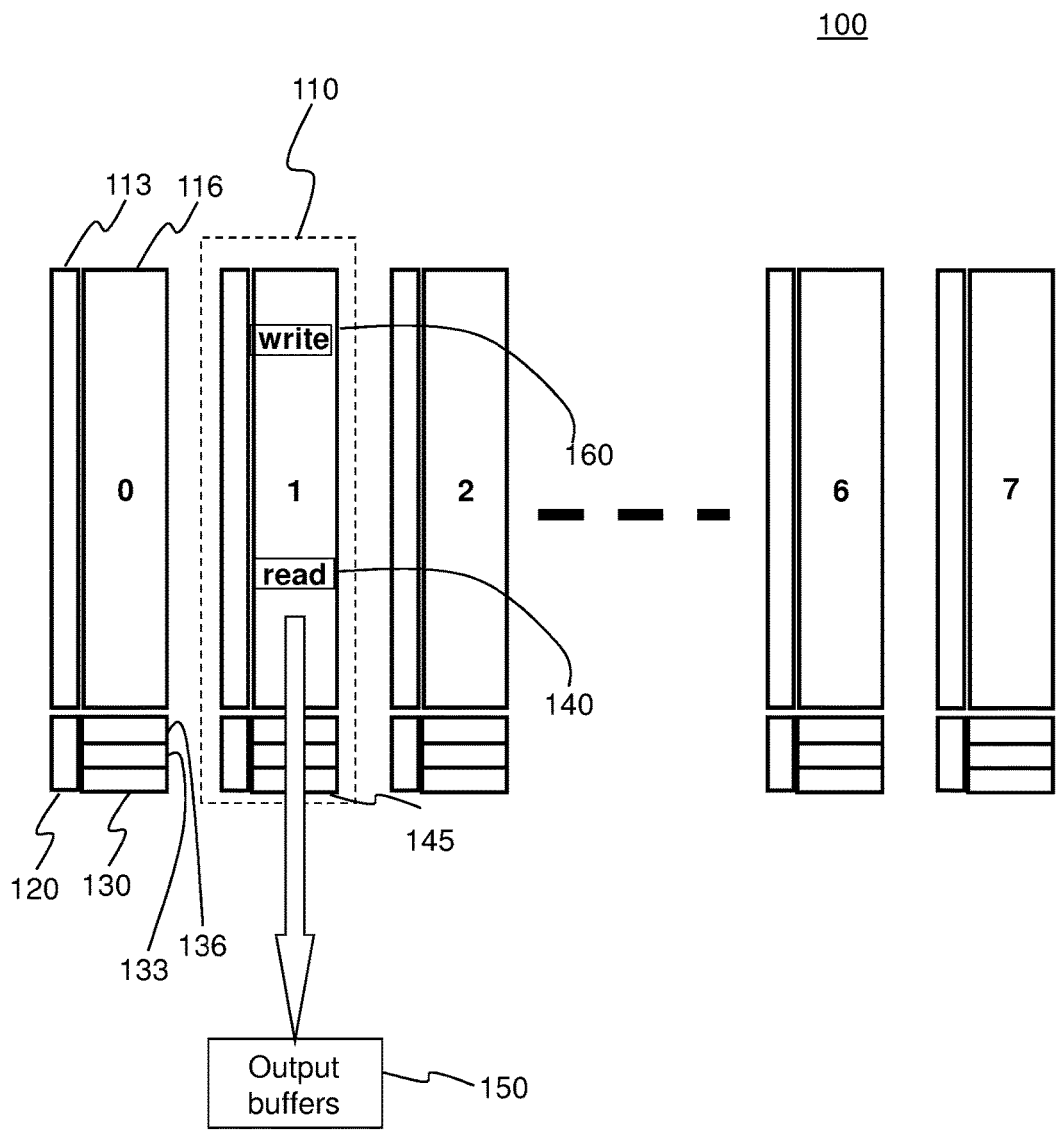
FIGS. 1-2 are schematic diagrams of embodiments of a portion of memory.

Reference throughout this specification to "one embodiment" or "an embodiment" means that a particular feature, structure, or characteristic described in connection with the embodiment is included in at least one embodiment of claimed subject matter. Thus, appearances of phrases such as "in one embodiment" or "an embodiment" in various places throughout this specification are not necessarily all referring to the same embodiment. Furthermore, particular features, structures, or characteristics may be combined in one or more embodiments.

Some types of memory devices may comprise a memory cell array partitioned into groups of memory cells, sometimes referred to as pages or partitions; although, likewise, a memory cell array may not necessarily be divided into pages or partitions. Historically, memories are arranged or organized so that, if a write or erase operation is being performed, for an array, or a partition or page of an array, then other operations are not permitted within the array or, if applicable, within the particular partition or page. However, this limitation may be more restrictive than needed.

In general, memory cells may share common electronic circuitry for performing different operations. Therefore, prohibiting other operations on the particular cells involved in the write operation may be prudent; however, as an example, having a capability to read or erase from another memory cell concurrently with the write operation within the array, or partition or page, if applicable, may be desirable. It is noted that in the description of a particular embodiment below we refer to partitions, but it is to be understood that this is intended to be illustrative and not limiting.

A write memory operation within a partition may result in prohibition of a concurrent memory operation, such as a read or erase operation, in the same partition. Write operations may be initiated, for example, by a processor executing an application.

One approach has been to employ separate partitions for storing different types of information. For example, one partition may store code to be executed, whereas another partition may store binary digital signals to be processed. Therefore, the partition storing the code is not delayed by a write operation since the code is read from a different partition than the partition in which a write operation is being performed. However, structuring code in this manner can be restrictive at times.

Another approach has been to mask interrupts until the write operation is being performed. If a request is made to perform an operation that is sufficiently time sensitive or where it is otherwise preferable to not delay execution, on an exception basis the write operation may be suspended so that this interrupt may be serviced. An operating system or application executed by a processor may include an exception handler to perform particular operations in response to an exception state. After that, the write operation may then be resumed and completed. However, here, delays may result that may hold up execution. For example, downstream operations subsequent to the write operation may be delayed.

In one embodiment, concurrent performance of a read operation within a particular partition while executing a write operation within that partition may be referred to here as a read-while-write operation. Of course, claimed subject matter is not limited to a read operation being the concurrent operation. For example, concurrent performance of a write operation within a particular partition while executing an erase operation within that partition may be referred to here as a write-while-erase operation. In yet another example, concurrent performance of a read operation within a particular partition while executing an erase operation within that partition may be referred to here as a read-while-erase operation. Nonetheless, continuing with an example embodiment, a technique to perform a read-while-write operation in a partition of a memory device may comprise unmapping virtual memory addresses within the partition that are the object of a write operation being executed. For example, unmapping may be performed using a memory management unit (MMU) coprocessor or virtual address tables. Unmapping may result in physical memory locations within the particular partition previously associated with the virtual memory addresses being inaccessible.

If this approach is employed, dividing the code and the information to be processed into separate partitions is not required. Furthermore, within a partition, code execution may continue while a write operation is performed if the memory locations to which digital signals are being written are not involved. For example, other memory locations within the partition may be read while memory locations of the partition are erased or while digital signals are written to those latter memory locations.

If, however, access is attempted, an MMU coprocessor, for example, in a particular embodiment, may generate an exception state to modify flow of program execution. An exception state may be handled or resolved by saving a current state of program execution in a particular location of memory and switching program execution to a particular subroutine known as an exception handler. As described below, the exception handler may later resume program execution at the original program location using the saved state information.

As an example, if a read command is received while performing a write operation, an exception may be generated if, for example, physical addresses of the read command and physical addresses of the write operation share any common memory locations (e.g., memory overlap). If an exception is generated, processing may be applied to determine appropriate action as a result of generating the exception. For example, the operation that generated the exception may be delayed until the write operation is complete.

Alternatively, the write operation may be suspended and the affected physical addresses may be remapped as virtual addresses. Remapping may allow those physical memory locations to be accessible. Subsequently, the operation that generated the exception may be performed. After performing that operation, the virtual memory addresses corresponding to the physical addresses associated with the write operation may again be unmapped, and the write operation may be resumed.

FIG. 1 is a schematic diagram of an embodiment of a portion 100 of memory. For example, as previously indicated, a memory may comprise NAND, NOR, or PCM flash memory that may be organized in partitions of memory cells. In the following description, a portion of memory may be described as comprising eight partitions. A particular number of partitions is described for illustrative purposes. However, the number of partitions involved in embodiments is not limited to any particular number and claimed subject matter is not limited in this respect.

Continuing with the description of FIG. 1, memory portion 100 may include a number (e.g., eight) of partitions 110. In one implementation, partitions may comprise memory cell array 116, row decoder 113, column decoder 136, program loads 133 (e.g., used during write operations to determine memory cells to be written), one or more sense amplifiers 130, and other circuitry 120 involved in read/write operations of the associated or particular partition, for example.

In an implementation, a read operation may occur concurrently with a write operation. If the read operation involves different memory locations than the write operation, no contention or conflict need occur. For example, read operation 140 may occur concurrently with write operation 160. Read operation 140 may include measuring states of read memory cells in partition 1 via sense amplifiers 145 and writing information representative of the states into an output buffer 150, for example.

Figure 2:
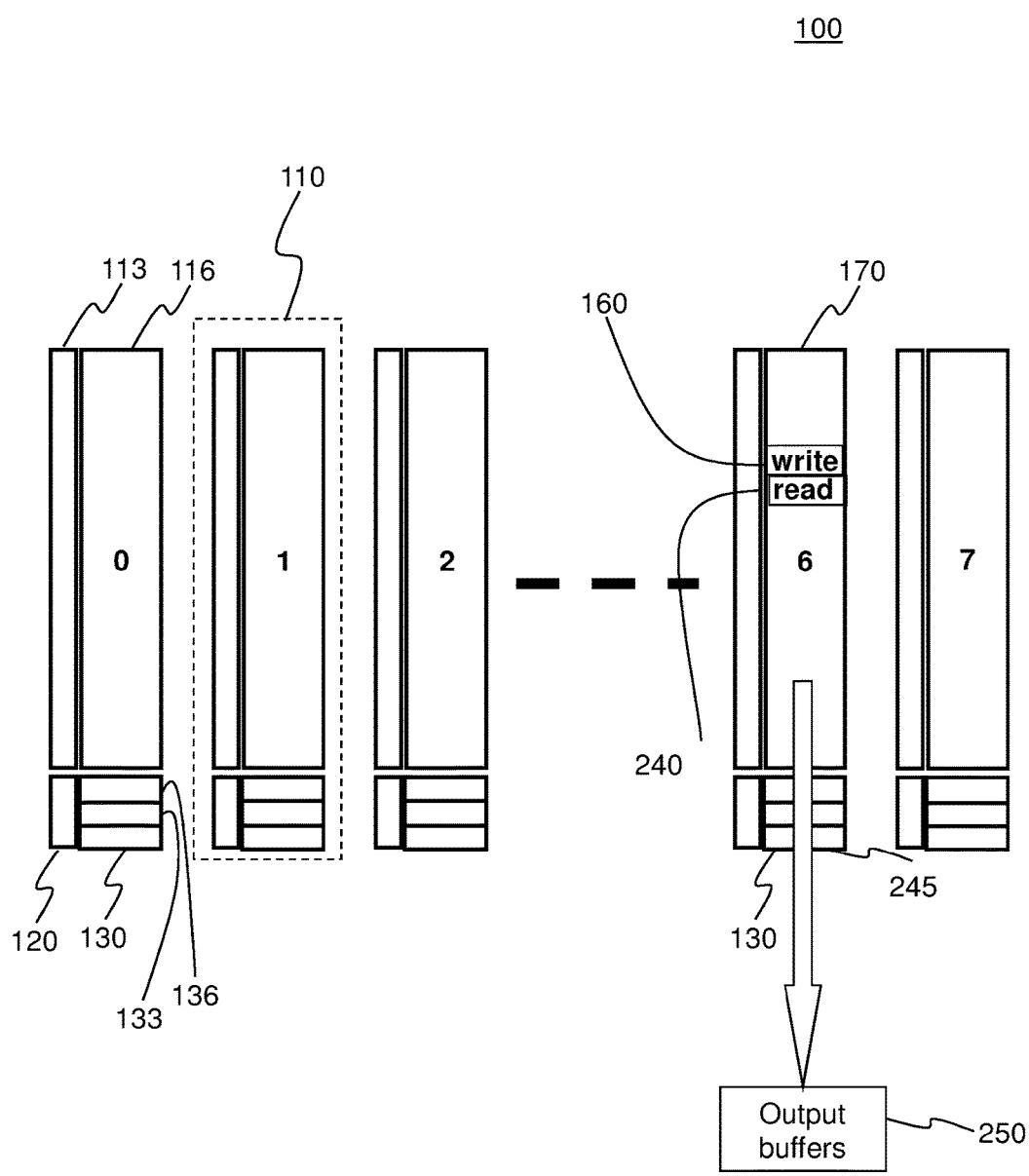

FIG. 2 is a schematic diagram of the memory portion of FIG. 1. As mentioned above, a read operation may occur concurrently with a write operation in the same partition if different memory locations are involved for the respective operations. However, if there is overlap in memory locations between the operations, a conflict may occur. In particular, read operation 240 to read from partition 6 may not be able to occur concurrently with write operation 260 to write to partition 6 if any memory locations are in common. In one implementation, for example, after receiving a command to perform read operation 240, an exception may be generated. As a result of generating the exception, a determination may be made regarding whether to suspend write operation 260 until read operation 240 is complete or to delay performing read operation 240 until write operation 260 is complete. In another implementation, read operation 240 may be denied. If a read operation is performed, measuring states of read memory cells in partition 6 via sense amplifiers 245 and writing information representative of the states into an output buffer 250 may take place, for example. Though a read operation is described, it is to be understood that an erase operation or an additional write operation may instead be considered in the example embodiments, and claimed subject matter is not limited in this respect.

Figure 3:
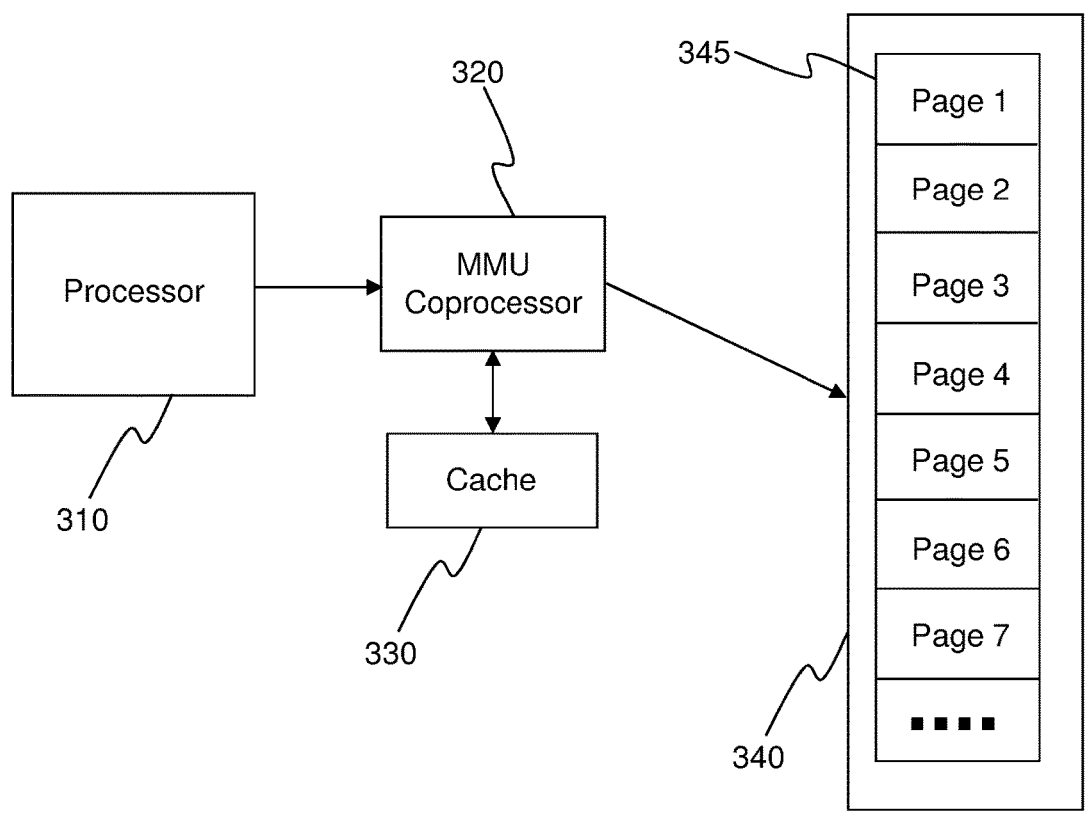
FIG. 3 is a block diagram of an embodiment of a portion of a computing system.

FIG. 3 is a block diagram of an embodiment of a portion 300 of a computing system. A processor 310 may be capable of accessing a memory 340 using linear or virtual addresses. For example, processor 310 may incorporate a MMU coprocessor 320 to translate between virtual memory addresses and physical memory addresses of memory 340. Virtual memory addresses may be used by an operating system or an application executed by processor 310, for example. MMU coprocessor 320 may utilize a cache memory 330 to maintain tables of virtual memory addresses and physical memory addresses, though claimed subject matter is not so limited. Processor 310 may be capable of supporting fetch exceptions for stored executable code or other stored information. For example, a subroutine comprising executable code may be called (e.g., performed) if access to an inaccessible memory location is attempted. Processor 310 may comprise any of a number of types of processors, including, but not limited to ARM11, ARM Cortex A8 or A9 (available from ARM Holdings, plc. of Cambridge, England), or Intel x86 CPUs (x>386) (available from Intel Corporation of Santa Clara, Calif.), just to list a few examples. As counter examples, ARM7, ARM Cortex M, or Intel 286 may not provide requisite abilities to perform some operations described herein.

Memory 340 may comprise an array of memory cells partitioned into partitions or pages 345 for example. Memory 340 may be capable of operating as an execute-in-place (XIP) memory device. For example, at least a portion of memory 340 may be accessible through a RAM-like interface so that the portion of memory may be directly mapped in a physical CPU-addressable address space. Examples of memory types that may be used as XIP memory devices may include PCM, NOR flash memory, or OneNAND (available from Samsung Group of Seoul, South Korea), just to list a few examples. In an implementation, memory 340 may be partitioned into partitions, wherein a partition may comprise a memory array region on which an operation, such as a read operation, for example, may be performed independently of operations that are simultaneously performed on another partition. Accordingly, for example, a read operation may be performed in one partition of memory 340 while a concurrent write or erase operation performed on another partition need not be suspended. Of course, these details of a portion of a computing system are merely examples, and claimed subject matter is not so limited.

Figure 4:
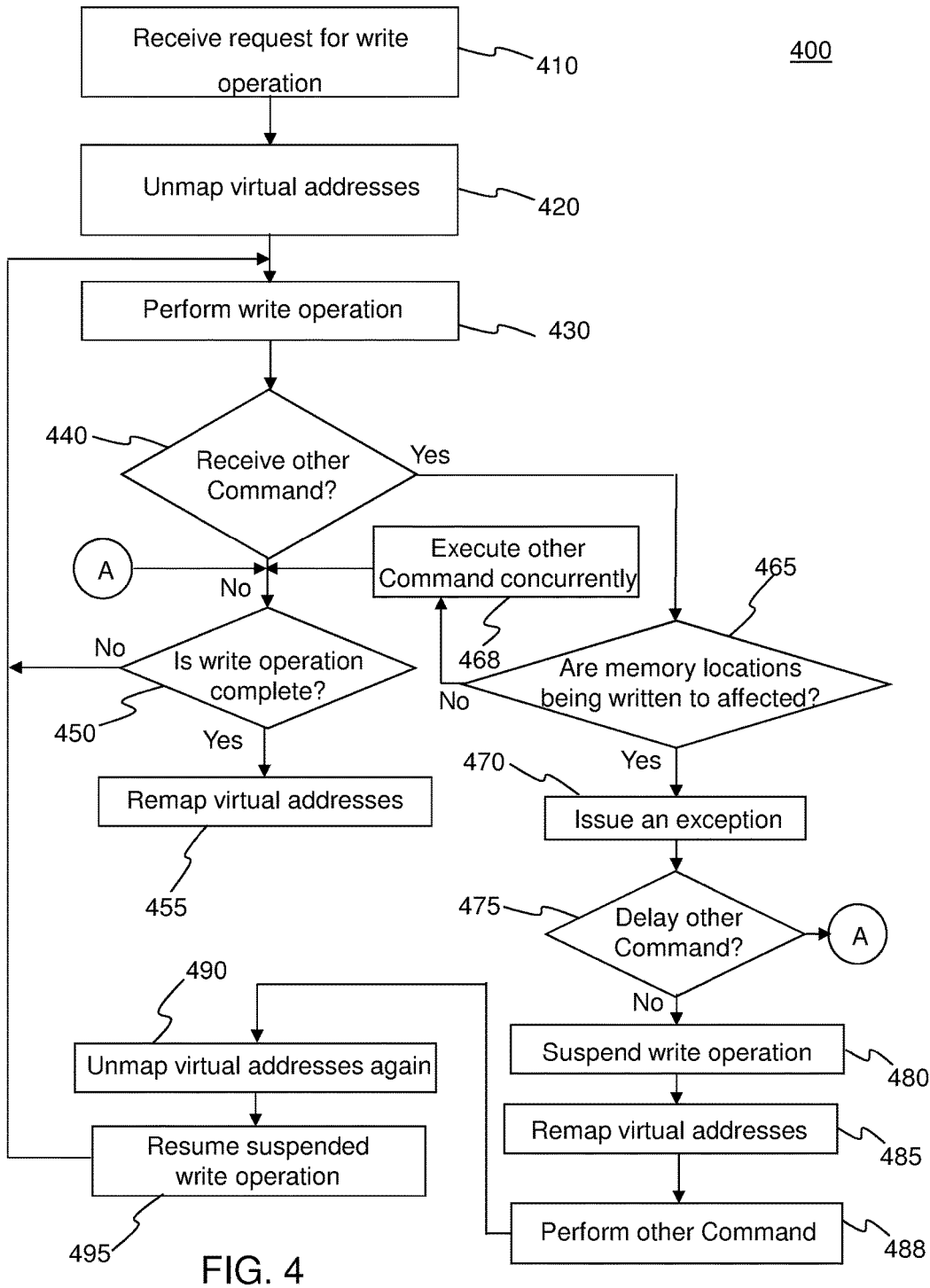
FIG. 4 is a flow diagram of an embodiment of a process to perform a concurrent memory operation while performing a write operation.

FIG. 4 is a flow diagram of an embodiment of a process 400. Such a process, for example, may be performed using portion 300 of a computing system shown in FIG. 3. At block 410, a request to perform a write operation for a particular partition of memory may be received from a processor, for example. At block 420, an MMU coprocessor may be used to unmap virtual addresses that correspond to physical addresses affected by the write operation to make the physical addresses inaccessible. At block 430, the write operation may be performed on the particular partition of memory. At diamond 440, a determination may be made as to whether another command or operation (e.g., an erase, read, or another write operation) has been received or initiated by a processor while the write operation is performed. If not, then process 400 may proceed to diamond 450 where a determination may be made as to whether the write operation is complete. If so, then process 400 may proceed to block 455, where virtual addresses may be remapped to the physical addresses affected by the write operation. However, if the write operation is not complete, then process 400 may return to block 430 to continue to perform the write operation.

At diamond 440, if a determination is made that a command is received while performing the write operation, then process 400 may proceed to diamond 465 where a determination may be made as to whether that newly-received command would affect at least some of the same physical memory locations affected by the write operation. If so, then process 400 may proceed to block 470, where an exception may be issued. On the other hand, if the newly-received command would not affect at least some of the same physical memory locations affected by the write operation, then process 400 may proceed to block 468, where the newly-received command may be executed concurrently with the write operation. Accordingly, process 400 may return to diamond 450 where a determination may be made as to whether the write operation is complete, as described above.

Continuing with process 400 at block 470, where an exception may be issued, at diamond 475, a determination may be made regarding whether to delay the operation of the newly-receive command that resulted in generation of the exception. If so, then process 400 may proceed to diamond 450 to determine whether the write operation is complete. If not, at block 480, the write operation may be suspended to prepare for or allow execution of the operation of the newly-receive command. At block 485, virtual memory addresses may be remapped to the physical addresses affected by the write operation so that the memory operation that generated the exception may be performed, as shown at block 488. After the operation that generated the exception is complete, the virtual memory addresses associated with the physical addresses affected by the write operation may again be unmapped, as shown at block 490. Subsequently, at block 495, the suspended write operation may be resumed. Alternatively, if the operation that generated the exception may be delayed or denied, as indicated previously, then the write operation may continue until it is complete. After it is complete, virtual addresses may be remapped and the delayed operation may then be completed (not shown). Of course, details of process 400 are merely examples, and claimed subject matter is not so limited.

Figure 5:
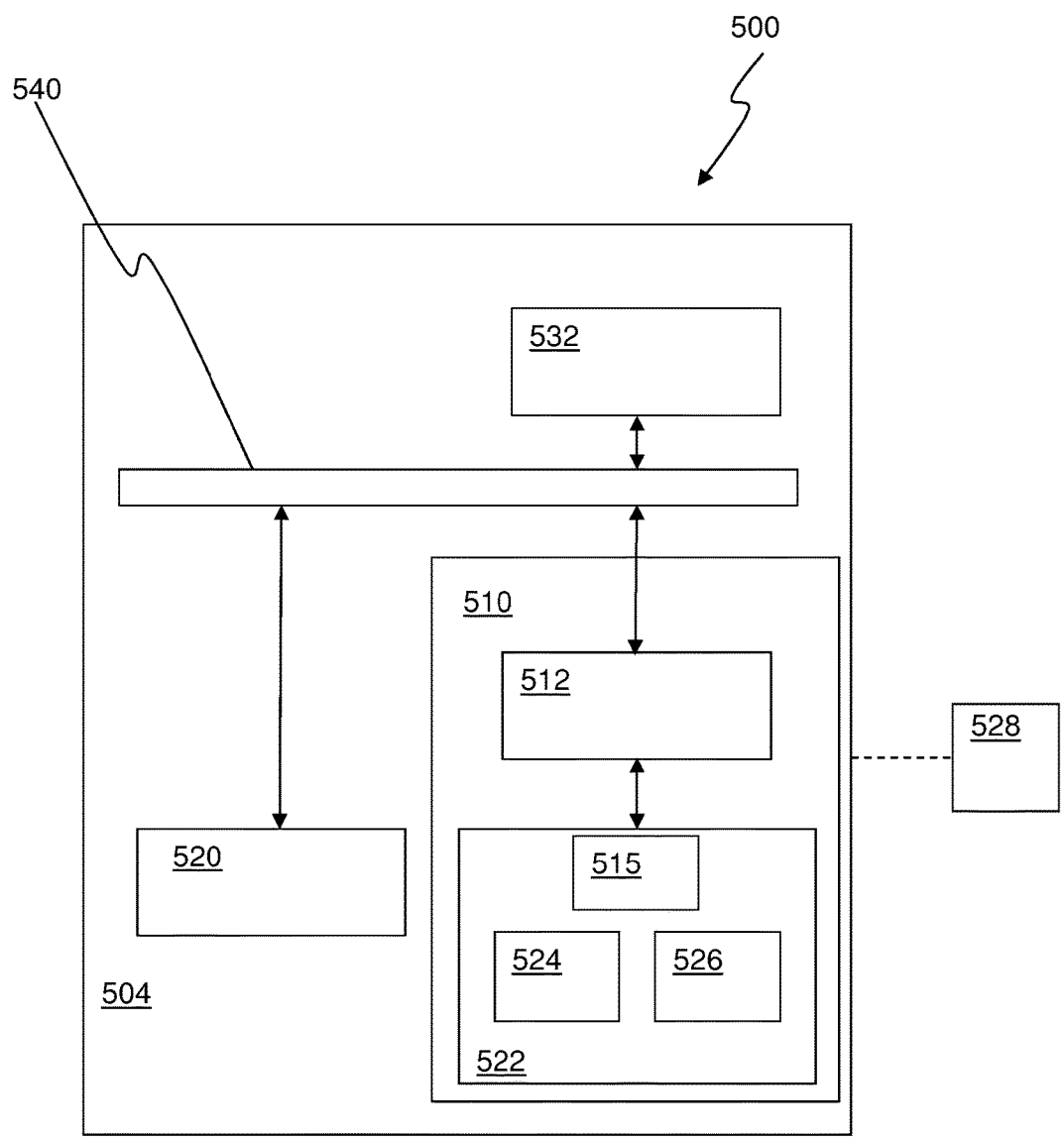
FIG. 5 is a schematic of another embodiment of a computing system.

FIG. 5 is a schematic diagram illustrating an embodiment of a computing system 500 including a memory device 510. A computing device may comprise one or more processors, for example, to execute an application or other code. A computing device 504 may be representative of any device, appliance, or machine that may be employed to manage memory device 510. Memory device 510 may include a memory microcontroller 515 and a memory 522. By way of example but not limitation, computing device 504 may include: one or more computing devices or platforms, such as, e.g., a desktop computer, a laptop computer, a workstation, a server device, or the like; one or more personal computing or communication devices or appliances, such as, e.g., a personal digital assistant, mobile communication device, or the like; a computing system or associated service provider capability, such as, e.g., a database or information storage service provider/system; or any combination thereof.

It is recognized that all or part of the various devices shown in system 500, and the processes and methods as further described herein, may be implemented using or otherwise including at least one of hardware, firmware, or software, other than software by itself. Thus, by way of example, but not limitation, computing device 504 may include at least one processing unit 520 that is operatively coupled to memory 522 through a bus 540 and a host or memory microcontroller 515. Processing unit 520 is representative of one or more devices capable of performing at least a portion of a computing procedure or process. By way of example, but not limitation, processing unit 520 may include one or more processors, controllers, microprocessors, microcontrollers, application specific integrated circuits, digital signal processors, programmable logic devices, field programmable gate arrays, and the like, or any combination thereof. Processing unit 520 may include an operating system to be executed that is capable of communication with memory microcontroller 515. An operating system may, for example, generate commands to be sent to memory microcontroller 515 over bus 540. Commands may comprise read, erase, or write commands, for example. In response to a read command, for example, memory microcontroller 515 may perform process 400 described above, to perform a read-while write process. In another example, in response to a write command while an erase is being performed, memory microcontroller 515 may perform process 400 described above, to perform a write-while erase process.

Memory 522 is representative of any information storage mechanism. Memory 522 may include, for example, a primary memory 524 or a secondary memory 526. Primary memory 524 may include, for example, a random access memory, read only memory, etc. While illustrated in this example as being separate from processing unit 520, it should be understood that all or part of primary memory 524 may be provided within or otherwise co-located/coupled with processing unit 520.

Secondary memory 526 may include, for example, the same or similar type of memory as primary memory or one or more information storage devices or systems, such as, for example, a disk drive, an optical disc drive, a tape drive, a solid state memory drive, etc. In certain implementations, secondary memory 526 may be operatively receptive of, or otherwise capable of being operatively coupled to a computer-readable medium 528. Computer-readable medium 528 may include, for example, any medium that is able to store, carry or make accessible rewritable information, code, or instructions for one or more of device in system 500. Computing device 504 may include, for example, an input/output device or unit 532.

In a particular embodiment, computing system 500 may include memory device 522 comprising memory 524, and memory microcontroller 515 or MMU coprocessor to map, remap or unmap virtual memory addresses corresponding to physical memory locations. Computing system 500 may also include processing unit 520 to host one or more applications or operating systems or to initiate read commands directed to memory microcontroller 515 to provide access to memory cells in memory 524, for example.

Input/output unit or device 532 is representative of one or more devices or features that may be capable of accepting or otherwise receiving inputs from a human or a machine, or one or more devices or features that may be capable of delivering or otherwise providing outputs to be received by a human or a machine. By way of example but not limitation, input/output device 532 may include a display, speaker, keyboard, mouse, trackball, touch screen, etc.

It will, of course, be understood that, although particular embodiments have just been described, claimed subject matter is not limited in scope to a particular embodiment or implementation. For example, one embodiment may be in hardware, such as implemented on a device or combination of devices, for example. Likewise, although claimed subject matter is not limited in scope in this respect, one embodiment may comprise one or more articles, such as a storage medium or storage media that may have stored thereon instructions capable of being executed by a specific or special purpose system or apparatus, for example, to result in performance of an embodiment of a method in accordance with claimed subject matter, such as one of the embodiments previously described, for example. However, claimed subject matter is, of course, not limited to one of the embodiments described necessarily. Furthermore, a specific or special purpose computing platform may include one or more processing units or processors, one or more input/output devices, such as a display, a keyboard or a mouse, or one or more memories, such as static random access memory, dynamic random access memory, flash memory, or a hard drive, although, again, claimed subject matter is not limited in scope to this example.

In the preceding description, various aspects of claimed subject matter have been described. For purposes of explanation, specific numbers, systems, or configurations may have been set forth to provide a thorough understanding of claimed subject matter. However, it should be apparent to one skilled in the art having the benefit of this disclosure that claimed subject matter may be practiced without those specific details. In other instances, features that would be understood by one of ordinary skill were omitted or simplified so as not to obscure claimed subject matter. While certain features have been illustrated or described herein, many modifications, substitutions, changes, or equivalents may now occur to those skilled in the art. It is, therefore, to be understood that the appended claims are intended to cover all such modifications or changes as fall within the true spirit of claimed subject matter.

What is claimed is:

1. A method for performing memory operations, comprising:
    unmapping virtual memory addresses corresponding to physical addresses within a partition where a first operation is to be performed;
    performing at least part of the first operation;
    receiving a command for a second operation within the partition while performing the first operation;
    determining whether the second operation affects the physical addresses;
    if the second operation affects the physical addresses, selecting whether to suspend performance of the first operation until the second operation is complete or delay the second operation until the first operation is complete; and
    if the second operation does not affect the physical addresses, concurrently performing the first and second operations while the virtual memory addresses corresponding to the physical addresses are unmapped,
    wherein the second operation is of a different type from the first operation.

2. The method of claim 1, wherein one of the first and second operations is performed on at least some of the unmapped virtual memory addresses corresponding to the physical addresses and the other one of the first and second operations is performed on other physical addresses different from the physical addresses corresponding to the unmapped virtual memory addresses.

3. The method of claim 1, wherein determining whether the second operation affects the physical addresses, comprises determining that the second operation affects the physical addresses, and further comprising: issuing an exception state in response to determining that the second operation affects the physical addresses.

4. The method of claim 3, further comprising:
    delaying execution of the second operation after issuing the exception state.

5. The method of claim 4, further comprising:
    remapping the virtual memory addresses;
    suspending the first operation; and
    performing the second operation after issuing the exception state.

6. The method of claim 5, further comprising:
    resuming the suspended first operation after the second operation is complete.

7. The method of claim 6, further comprising:
    unmapping the virtual memory addresses before resuming the suspended first operation.

8. The method of claim 1, wherein the first operation comprises a read operation, a write operation, or an erase operation.

9. The method of claim 8, wherein the second operation comprises a read operation, a write operation, or an erase operation, exclusive of the first operation.

10. The method of claim 1, wherein the first and second operations are performed in a same memory array.

11. A memory device comprising:
    a memory controller to perform a first operation on a portion of a memory array corresponding to a set of physical addresses; and
    a memory management unit (MMU) coprocessor to unmap virtual memory addresses associated with the set of physical addresses within a partition, wherein at least one of the memory controller or the MMU coprocessor is configured to determine whether to:
        suspend performance of the first operation until a second operation within the partition is complete or delay the second operation until the first operation is complete, if the second operation affects the set of physical addresses; and
        concurrently perform the first and second operations while the virtual memory addresses corresponding to the set of physical addresses are unmapped, if the second operation does not affect the set of physical addresses; and
    wherein the second operation is of a different type from the first operation.

12. The memory device of claim 11, wherein the MMU coprocessor is adapted to delay or deny accesses by the second operation of the set of physical addresses during the first operation.

13. The memory device of claim 11, wherein the MMU coprocessor is adapted to flag as invalid accesses affecting the portion of the memory array by the second operation during the first operation.

14. The memory device of claim 11, wherein the MMU coprocessor is adapted to remap the virtual memory addresses to physical addresses corresponding to the portion of the memory array to allow the second operation to be performed.

15. The memory device of claim 11, wherein the memory array comprises NOR flash memory cells.

16. A system comprising:
a memory device including a portion of a memory array corresponding to a set of physical addresses;
a memory controller to perform a first operation on the portion of the memory array;
a memory management unit (MMU) coprocessor to unmap virtual memory addresses associated with the set of physical addresses within a partition, wherein at least one of the memory controller or the MMU coprocessor is configured to determine whether to:
suspend performance of the first operation until a second operation within the partition is complete or delay the second operation until the first operation is complete, if the second operation affects the set of physical addresses; and
concurrently perform the first and second operations while the virtual memory addresses corresponding to the set of physical addresses are unmapped, if the second operation does not affect the set of physical addresses, wherein the second operation is of a different type from the first operation; and
a processor to host one or more applications and to initiate the first operation or the second operation to provide access to the portion of the memory array.

17. The system of claim 16, wherein the MMU coprocessor is adapted to flag as invalid accesses affecting the portion of memory by the second operation during the first operation.

18. The system of claim 17, wherein the system is configured to suspend performance of the first operation until the second operation is complete or delay the second operation until the first operation is complete, as a result of the MMU coprocessor flagging accesses affecting the portion of memory as invalid.

19. The system of claim 16, wherein the MMU coprocessor is adapted to delay or deny accesses by the second operation of the set of physical addresses during the first operation.

20. The system of claim 16, wherein the system is: a desktop computer, a laptop computer, a workstation, a server device, a personal digital assistant, a mobile communication device, or any combination thereof.

* * * * *